(12) United States Patent
Lin et al.

(10) Patent No.: US 12,238,933 B2
(45) Date of Patent: Feb. 25, 2025

(54) SEMICONDUCTOR STRUCTURES AND METHODS OF FORMING THE SAME

(71) Applicant: Taiwan Semiconductor Manufacturing Company, Ltd., Hsinchu (TW)

(72) Inventors: Yu-Chao Lin, Hsinchu (TW); Chih-Sheng Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 347 days.

(21) Appl. No.: 17/580,595

(22) Filed: Jan. 20, 2022

(65) Prior Publication Data

US 2023/0140053 A1  May 4, 2023

Related U.S. Application Data

(60) Provisional application No. 63/275,941, filed on Nov. 4, 2021.

(51) Int. Cl.
| | | |
|---|---|---|
| *H10B 51/30* | (2023.01) | |
| *H01L 23/522* | (2006.01) | |
| *H01L 29/66* | (2006.01) | |
| *H10B 63/10* | (2023.01) | |
| *H10N 70/20* | (2023.01) | |

(52) U.S. Cl.
CPC ......... *H10B 51/30* (2023.02); *H01L 23/5226* (2013.01); *H01L 29/6656* (2013.01); *H10B 63/10* (2023.02); *H10N 70/231* (2023.02)

(58) Field of Classification Search
CPC ........................ H10B 51/30; H10B 63/00–845; H10B 12/31; H01L 29/6656; H01L 23/5226; H01L 21/28008
See application file for complete search history.

(56) References Cited

U.S. PATENT DOCUMENTS

| | | | | |
|---|---|---|---|---|
| 2004/0178458 | A1* | 9/2004 | Eppich | H10B 12/31 |
| | | | | 257/E21.018 |
| 2005/0093084 | A1* | 5/2005 | Wang | H01L 29/1054 |
| | | | | 257/E21.431 |
| 2019/0130957 | A1* | 5/2019 | Müller | H10B 51/30 |
| 2020/0105772 | A1* | 4/2020 | Chen | H01L 28/60 |
| 2020/0105780 | A1* | 4/2020 | Lai | H01L 29/792 |
| 2021/0217812 | A1* | 7/2021 | Hsiao | H10B 61/00 |
| 2021/0335799 | A1* | 10/2021 | Lee | H01L 28/40 |
| 2021/0343731 | A1* | 11/2021 | Chen | H10B 53/30 |

OTHER PUBLICATIONS

Xiao, Introduction to Semiconductor Manufacturing Technology, Ch.9, 2012 (Year: 2012).*

* cited by examiner

*Primary Examiner* — Syed I Gheyas
*Assistant Examiner* — Casey Paul Boatman
(74) *Attorney, Agent, or Firm* — JCIPRNET

(57) ABSTRACT

A semiconductor structure includes a base layer, a metal-containing gate, a high-k layer and a spacer. The metal-containing gate is disposed over the base layer. The high-k layer is disposed between the base layer and the metal-containing gate. The high-k layer has a protruding portion that protrudes out from a bottom of the metal-containing gate. The spacer is disposed on the sidewall of the metal-containing gate and covers the protruding portion of the high-k layer.

20 Claims, 10 Drawing Sheets

660: 601, 610, 620, 630, 640
680: 612, 618, 622, 628, 632, 638, 642, 648
690: 660, 680

SEMICONDUCTOR STRUCTURES AND METHODS OF FORMING THE SAME

CROSS-REFERENCE TO RELATED APPLICATION

This application claims the priority benefit of U.S. provisional application Ser. No. 63/275,941, filed on Nov. 4, 2021. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs. Each generation has smaller and more complex circuits than the previous generation. In the course of IC evolution, two approaches have been developed to form a metal gate structure. The gate-last approach includes forming a dummy gate and replacing the dummy gate with a metal gate. The gate-first approach includes forming a metal layer and patterning the metal layer. Although the existing metal gate structures and forming methods thereof have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
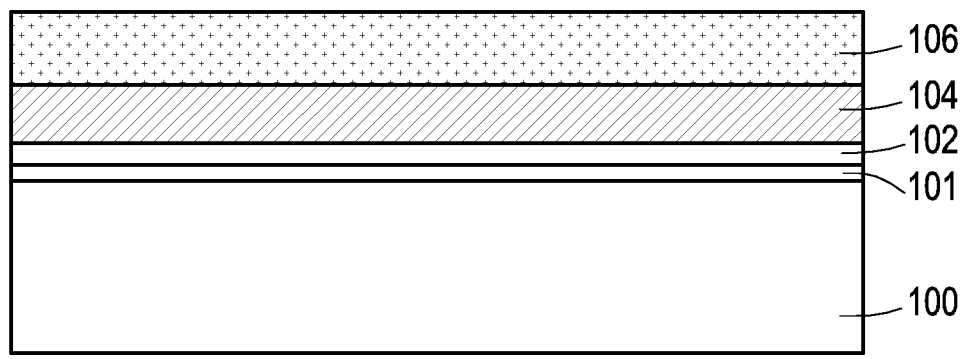
FIG. 1 to FIG. 6 are schematic cross-sectional views of a method of forming a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments of the disclosure, a gate-first approach is provided to form a metal-containing gate structure with simple process steps. With the method of the disclosure, the metal gate structure is well defined without high-k residue remaining, so that the device performance is accordingly improved.

FIG. 1 to FIG. 6 are schematic cross-sectional views of a method of forming a semiconductor structure in accordance with some embodiments. Throughout the various views and illustrative embodiments of the present disclosure, like reference numbers are used to designate like elements. It is understood that the disclosure is not limited by the method described below. Additional operations can be provided before, during, and/or after the method and some of the operations described below can be replaced or eliminated, for additional embodiments of the methods. Although FIG. 1 to FIG. 6 are described in relation to a method, it is appreciated that the structures disclosed in FIG. 1 to FIG. 6 are not limited to such a method, but instead may stand alone as structures independent of the method.

Referring to FIG. 1, a substrate 100 is provided. In some embodiments, the substrate 100 includes a silicon substrate, a silicon-on-insulator (SOI) substrate, a silicon germanium substrate, or a suitable semiconductor substrate. Other semiconductor materials including group III, group IV, and group V elements may also be used. In some embodiments, shallow trench isolation regions (not shown) are formed in the substrate 100, which define different device regions such as NMOS and PMOS device regions (not shown). In some embodiments, the substrate 100 is a planar substrate without fins. In other embodiments, the substrate 100 is a substrate with fins.

Thereafter, an interfacial material layer 101 is formed on the surface 100. In some embodiments, the interfacial material layer 101 has a dielectric constant less than about 8, less than about 6 or even less than about 4. In some embodiments, the interfacial material layer 101 includes silicon oxide, silicon oxynitride, the like, or a combination thereof. In some embodiments, the interfacial material layer 101 is formed by using thermal oxidation, ozone oxidation, chemical vapor deposition (CVD), atomic vapor deposition (ALD), or the like. In some embodiments, the thickness of the interfacial material layer 101 is between about 0.5 nm and about 2 nm. One skilled in the art will realize, however, that the thickness and other dimensions recited throughout the description are related to the scale of the formation technology of the integrated circuit.

Afterwards, a high-k material layer 102 is formed on the interfacial material layer 101. In some embodiments, the high-k material layer 102 has a dielectric constant greater than that of the interfacial material layer 101. For example, the high-k material layer 102 has a dielectric constant greater than about 10, greater than about 15 or even greater than about 20. In some embodiments, the high-k material layer 102 includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In other embodiments, the high-k material layer 102 can optionally include a silicate such as HfSiO, HfSiON LaSiO, AlSiO, a combination thereof, or a suitable material. In some embodiments, the method of forming the high-k material layer 102 includes performing a suitable deposition technique, such as CVD, ALD, physical vapor deposition (PVD), molecular beam deposition (MBD), or the like. In some embodiments, the thickness of the high-k material layer 102 is between about 1 nm and about 5 nm, although other values are contemplated and may he used.

Still referring to FIG. 1, a metal-containing gate material layer 104 is formed on the high-k material layer 102. In some embodiments, the metal-containing gate material layer 104 has a work function suitable for forming NMOS devices, and the material thereof includes Ti, Ag, Al, TaAl, TaAlC, TiAlN, TaC, TaCN, TaSiN, Mn, Zr, a suitable n-type work function material, or a combination thereof. In other embodiments, the metal-containing gate material layer 104 has a work function suitable for forming PMOS devices, and the material thereof includes TiN, TaN, Ru, Mo, Al, WN, $ZrSi_2$, $MoSi_2$, $TaSi_2$, $NiSi_2$, WN, W, WS, $MoS_2$, a suitable p-type work function material, or a combination thereof. In some embodiments, a low-resistance metal layer is further included in the metal-containing gate material layer 104, and the low-resistance metal layer includes W, Al, Cu, the like, or a combination thereof. In some embodiments, the method of forming the metal-containing gate material layer 104 includes performing a suitable deposition technique, such as CVD, ALD, PVD, MBD or the like. In some embodiments, the thickness of the metal-containing gate material layer 104 is between about 5 nm and about 30 nm, although other values are contemplated and may be used.

Thereafter, a silicon material layer 106 is formed on the metal-containing gate material layer 104. In some embodiments, the silicon material layer 106 includes substantially pure silicon. For example, the silicon material layer 106 has a silicon content of about 90 at %, 95 at % or more. In some embodiments, the silicon material layer 106 is a polysilicon layer. In other embodiments, the silicon material layer 106 includes an amorphous silicon layer. In other embodiments, the silicon material layer 106 is a single-crystalline silicon layer.

In some embodiments, the silicon material layer 106 a single layer. In other embodiments, the silicon material layer 106 is a multi-layer structure including at least two materials selected from amorphous silicon, polysilicon and single-crystalline silicon. In some embodiments, the silicon material layer 106 is an un-doped silicon layer. In other embodiments, the silicon material layer 106 is a doped silicon layer. In some embodiments, the method of forming the metal-containing gate material layer 104 includes performing a suitable deposition technique, such as CVD, ALD, PVD, MBD or the like. In some embodiments, the thickness of the silicon material layer 106 is between about 20 nm and about 80 nm, although other values are contemplated and may be used.

Figure 2:
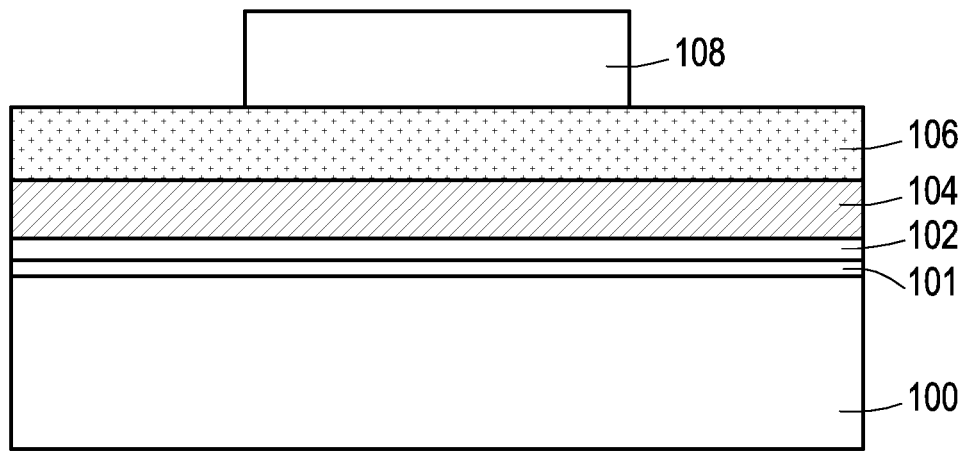

Referring to FIG. 2, a mask layer 108 is formed on the silicon material layer 106. In some embodiments, the mask layer 108 is a patterned photoresist layer formed by a photolithography process. In other embodiments, the mask layer 108 includes a dielectric material, such as silicon nitride, silicon oxynitride, silicon carbide, or the like, and is formed by a suitable deposition technique, such as CVD, ALD, PVD, MBD or the like. The silicon material layer 106 may have a single-layer or multi-layer structure.

Figure 3:
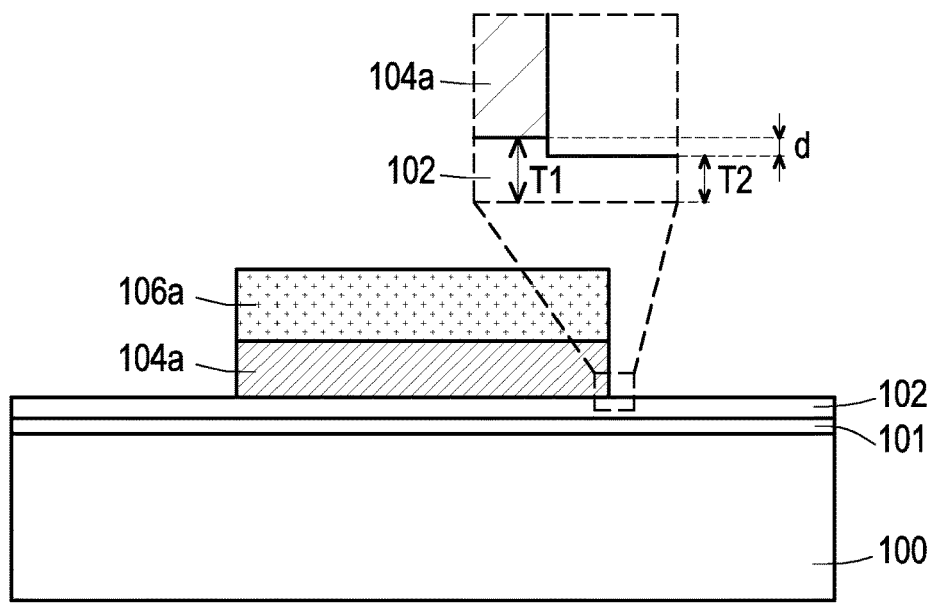

Referring to FIG. 3, the silicon material layer 106 and the metal-containing gate material layer 104 are patterned by using the mask layer 108 as a mask, until the top surface of the high-k material layer 102 is exposed. Specifically, the high-k material layer 102 serves as a stop layer during the patterning process. Upon the patterning process, a metal-containing gate 104a and a silicon layer 106a are sequentially stacked on the substrate 100. In some embodiments, the patterning process includes an anisotropic etching process, such as a dry etching process. In some embodiments, the etching gas includes $CH_2F_2$, $O_2$, $CF_4$ or a combination thereof. Other etching parameters include a substrate temperature of about 25 to 120° C., a process chamber pressure of about 1 to 100 mTorr, a plasma source power of 200 to 1,000 W, and a substrate bias power of about 0 to 200 W. The mask layer 108 is then removed.

In some embodiments, a silicon film is inserted between a metal film and a photoresist layer when defining the metal gate. Such silicon film not only increases the adhesion between the metal film and the photoresist layer, but also allows sufficient etching selectivity to well define the metal gate.

In some embodiments, the high-k material layer 102 uncovered by the mask layer 108 is substantially intact during the patterning process. In other embodiments, the high-k material layer 102 uncovered by the mask layer 108 is partially recessed. As shown in the enlarged view, the patterning process may partially remove the exposed portion of the high-k material layer 102, such that the high-k material layer 102 is thicker in the center portion but thinner in the edge portion after the patterning process. Specifically, the center portion of the high-k material layer 102 has a thickness T1, the edge portion of the high-k material layer 102 has a thickness T2, and the thickness T2 is less than the thickness T1.

In some embodiments, the top surface of the exposed edge portion of the high-k material layer 102 is rougher than the top surface of the center portion of the high-k material layer 102. Specifically, the top of the center portion of the high-k material layer 102 below the metal-containing gate layer 104a has a substantially smooth top surface, while the top of the protruding edge portion of the high-k material layer 102 outside of the metal-containing gate layer 104a has a rough and uneven top surface.

Figure 4:
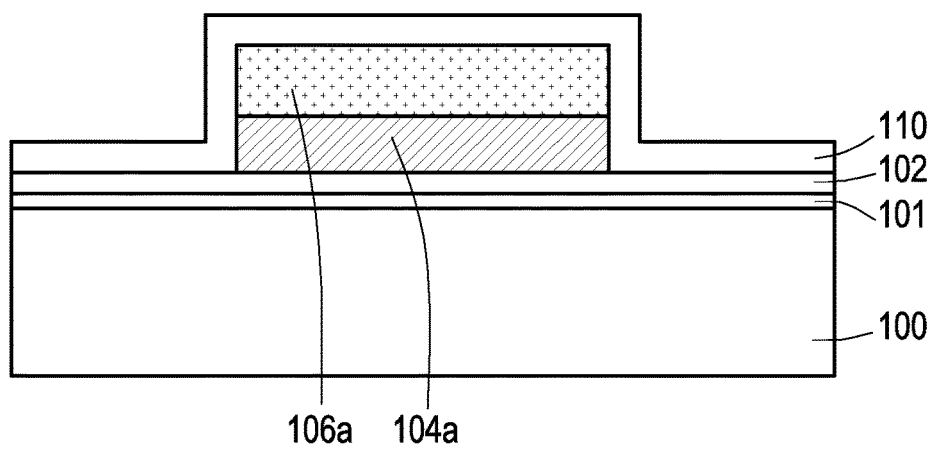

Referring to FIG. 4, a spacer material layer 110 is formed conformally on the substrate 100, covering the silicon layer 106a and the underlying metal-containing gate 104. In some embodiments, the spacer material layer 110 has a dielectric constant less than about 10, less than about 7 or even less than about 5. In some embodiments, the spacers 108 include a nitrogen-containing dielectric material, a carbon-containing dielectric material or both. In some embodiments, the spacer material layer 110 includes $Si_3N_4$, SiCN, SiOCN, SiOR (wherein R is an alkyl group such as $CH_3$, $C_2H_5$ or $C_3H_7$), SiC, SiOC, SiON, the like, or a combination thereof. In some embodiments, the method of forming the spacer material layer 110 includes performing a suitable deposition technique, such as CVD, ALD, PVD, MBD or the like. In some embodiments, the thickness of the spacer material layer 110 is between about 5 nm and about 10 nm, although other values are contemplated and may be used.

Figure 5:
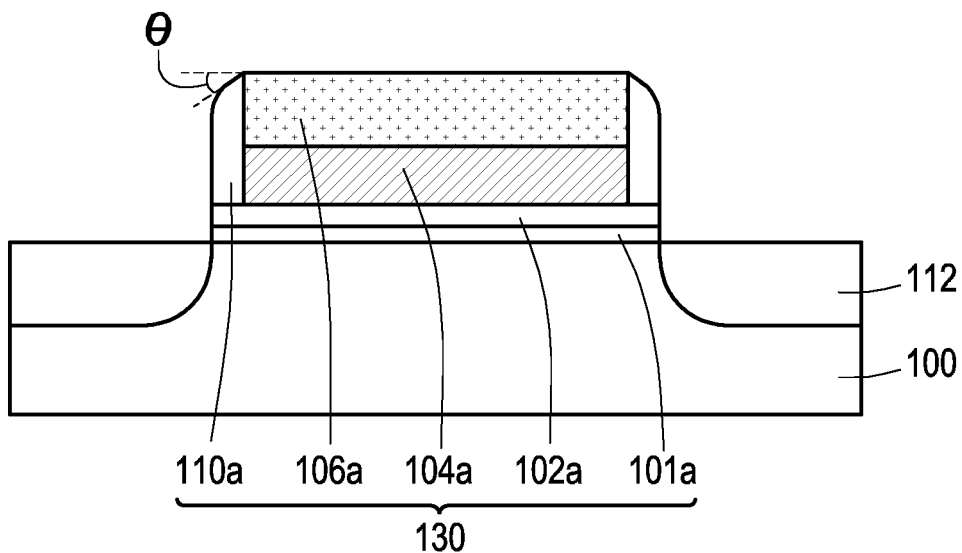

Referring to FIG. 5, the spacer material layer 110 is partially removed to form a spacer 110a on the sidewalls of the metal-containing gate 104a and the overlying silicon layer 106a. In some embodiments, the spacer material layer 110 is partially removed by an anisotropic etching process. In some embodiments, an included angle θ between an upper outer sidewall of the spacer 110a and an extending line of the top surface of the silicon layer 106a ranges from about 30 degrees to about 75 degrees.

Thereafter, the high-k material layer 102 and the interfacial material layer 101 are patterned by using the silicon layer 106a and the spacer 110a as a mask, so as to form an interfacial layer 101a and a high-k layer 102a sequentially stacked on the substrate 100. In some embodiments, the patterning process includes an anisotropic etching process, such as a dry etching process. In some embodiments, the etching gas includes $CHF_3$, $O_2$, $CF_4$, $Cl_2$, $BCl_3$, or a combination thereof. Other etching parameters include a substrate temperature of about 25 to 250° C., a process chamber pressure of about 5 to 60 mTorr, a plasma source power of about 400 to 1,200 W, and a substrate bias power of about 40 to 200 W. Upon the patterning process, the interfacial layer 101a, the high-k layer 102a, the metal-containing gate layer 104a, the silicon layer 106a and the spacer 110a constitute a metal gate structure 130 on the substrate 100. In some embodiments, the metal gate structure 130 has a width of about 20-100 nm and a height of about 50-100 nm.

Afterwards, source/drain regions 112 are formed in the substrate 100 beside the metal gate structure 130. In some embodiments, the source/drain regions 112 are formed by ion implantation process. In some embodiments, following the formation of the source/drain regions 112, silicide layers (not shown) are formed by siliciding the top portions of the source/drain regions 112. In some embodiments, the silicide layers may be in contact with the interfacial layer 101a and/or the high-k layer 102a.

Figure 6:
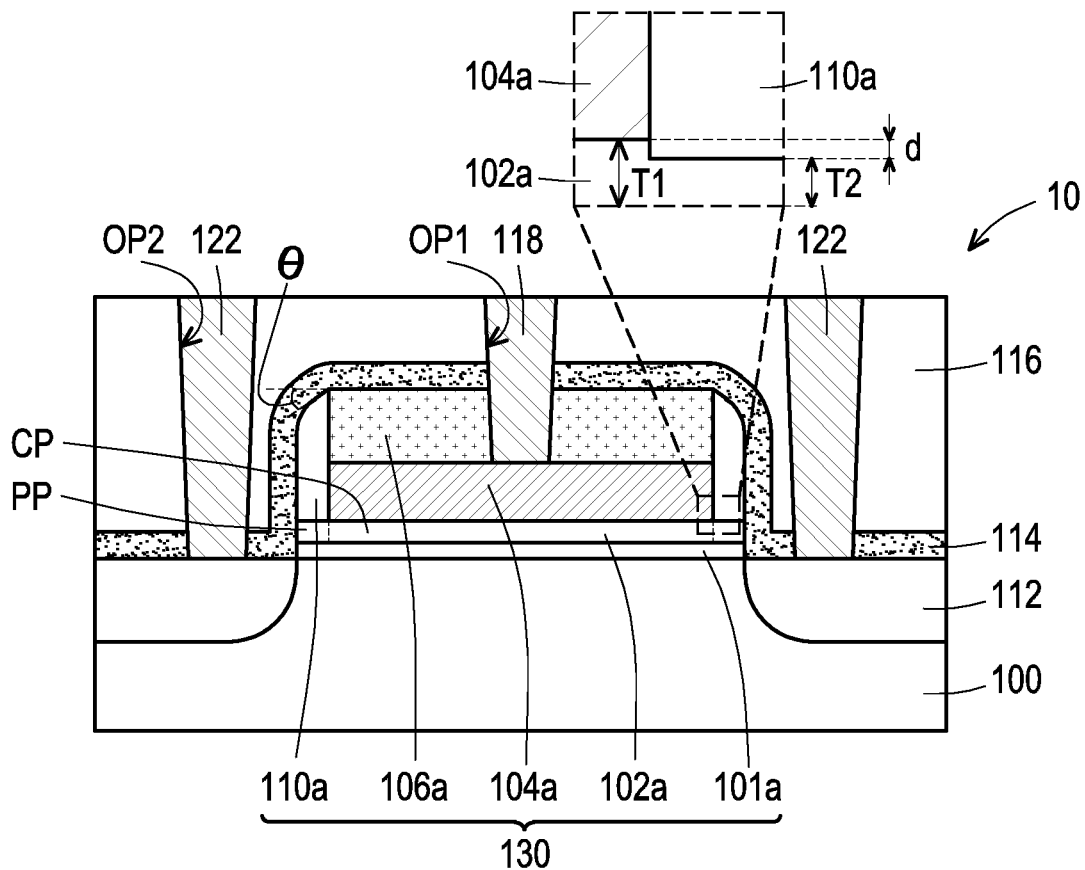

Referring to FIG. 6, a liner layer 114 is formed on the substrate 100 covering the metal gate structure 130. In some embodiments, the liner layer 114 encapsulates the sidewall and top of the metal gate structure 130, and is in physical contact with the interfacial layer 101a, the high-k layer 102a, the silicon layer 106a and the spacer 110a. The insulating liner layer is referred to as an "contact etch stop layer (CESL) in some examples. In some embodiments, the liner layer 114 includes SiN, SiC, SiCN, SiON, SiCON, the like, or a combination thereof. In other embodiments, a liner layer 114 serves as an etch stop layer and may include metal such as Ru, Co, the like, or a combination thereof. In some embodiments, the method of forming the liner layer 114 includes performing a suitable deposition technique, such as CVD, ALD, PVD, MBD or the like. In some embodiments, the thickness of the liner layer 114 is between about 10 nm and about 20 nm, although other values are contemplated and may be used.

In some embodiments, the liner layer 114 may be in contact with the interfacial layer 101a and the high-k layer 102a, as shown in FIG. 6. However, the disclosure is not limited thereto. In other embodiments, another spacer (not shown) is formed on the sidewall of metal gate structure 130, covering the sidewalls of the spacer 110a, the interfacial layer 101a and the high-k layer 102a.

Thereafter, a dielectric layer 116 is formed on the substrate 100 covering the liner layer 114. In some embodiments, the dielectric layer 116 may include a low-k dielectric material having a dielectric constant lower than about 4.0, 3.0, 2.0 or even 1.5. The dielectric layer 116 is referred to as a "low-k layer" in some exmaples. In some embodiments, the dielectric layer 116 may include a material such as silicon oxide, phosphosilicate glass (PSG), borophosphosilicate glass (BPSG), HDP (high density plasma) oxide, TEOS (tetraethylorthosilicate), SiOC, SiC, a combination thereof, a multilayer thereof, or the like. The method of forming the dielectric layer 116 may include performing a suitable deposition technique, such as CVD, ALD, PVD, MBD or the like.

Afterwards, conductive plugs 118 and 122 are formed over and electrically connected to the metal-containing gate 104a and the source/drain regions 112. In some embodiments, an opening pattern OP1 (or called "contact hole") is formed through the dielectric layer 116, the liner layer 114 and the silicon layer 106a and exposes a portion of the metal-containing gate 104a, and opening patterns OP2 are formed through the dielectric layer 116 and the liner layer 114 and exposes a portion of the source/drain regions 112. In some embodiments, a mask layer (e.g., a photoresist layer) is formed on the dielectric layer 116, covering the non-target area and exposing the target area such as the intended location of the subsequently formed contact holes. Thereafter, the dielectric layer 116, the etching stop layer 114 and the silicon layer 104a are partially removed by using the mask layer as an etch mask. In some embodiments, each of the opening patterns OP1 and OP2 can be formed having a circle-like shape, a stripe-like shape or any suitable shape as needed. In some embodiments, the opening patterns OP1 and OP2 are formed simultaneously. In some embodiments, the opening patterns OP1 and OP2 are formed separately.

Connectors or conductive plugs 118 and 122 are formed in the opening pattern OP1 and OP2. In some embodiments, the conductive plugs 118 and 122 are intended to represent any type of conductive materials and structures and are electrically connected to the corresponding gate and source/drain regions. In some embodiments, the conductive plugs 118 and 122 includes metal, such as W, Cu, an alloy thereof or any metal material with suitable resistance and gap-fill capability. In some embodiments, a metal layer is formed on the substrate 100 filling in the opening patterns OP1 and OP2. The metal layer is formed by sputtering, CVD, electrochemical plating (ECP), the like, or a combination thereof. A planarization step such as CMP is then performed to remove a portion of the metal layer until the top of the dielectric layer 116 is exposed. In some embodiments, the top surfaces of the conductive plugs 118 and 122 are substantially coplanar with the top surface of the dielectric layer 116. A semiconductor device 10 of the disclosure is thus completed. In some embodiments, upon the process requirements, an interconnect layer structure may be formed over and electrically connected to the conductive plugs 118 and 122 and therefore the metal gate structure 130 and source/drain regions 112.

When a metal film and a high-k film are defined in the same etching step, high-k residues occur and accordingly degrade the device performance. The problem has been resolved with the method of the disclosure. Specifically, a metal gate is defined first, a spacer is formed aside the metal gate, and the underlying high-film is then patterned by using the spacer as a mask. With the method of the disclosure, the metal gate structure is well defined without high-k residue remaining, so that the device performance is accordingly improved.

Figure 7:
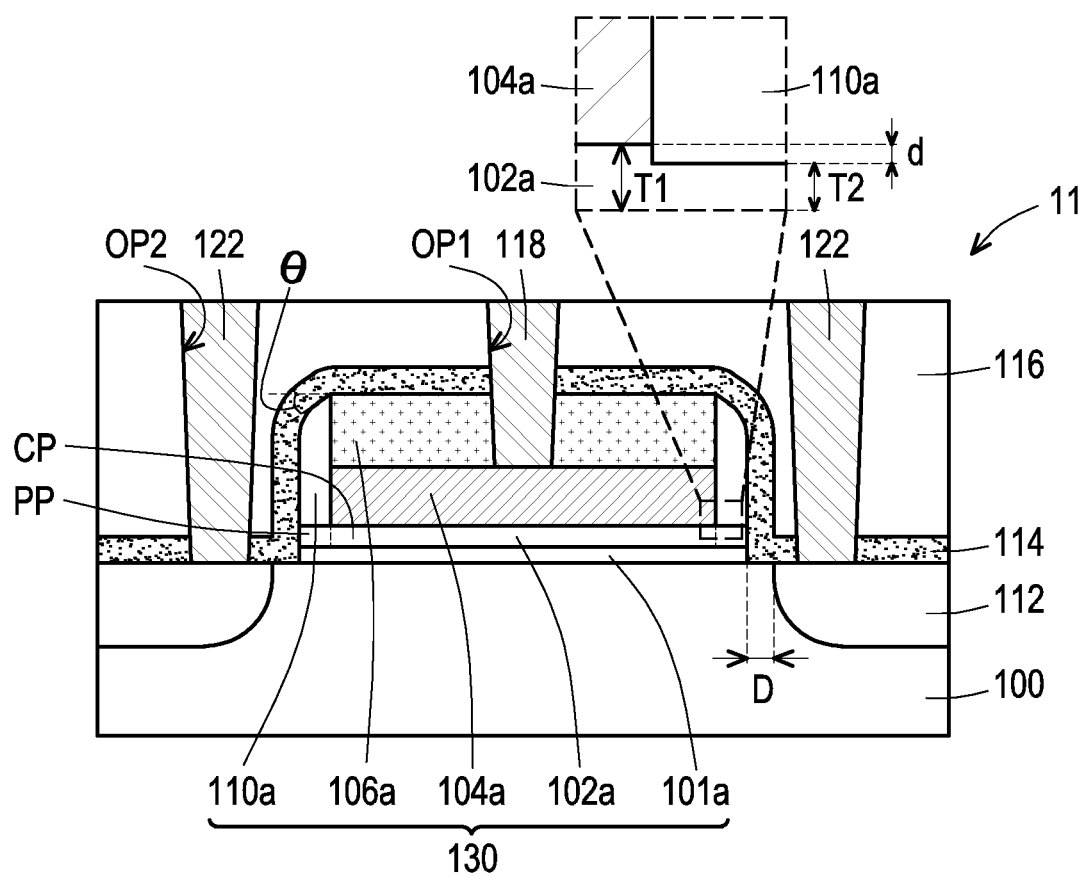
FIG. 7 is a cross-sectional view of a semiconductor structure in accordance with other embodiments.

FIG. 7 is a cross-sectional view of a semiconductor structure in accordance with other embodiments.

The semiconductor structure 11 is similar to the semiconductor structure 10, and the difference lies in the distance from the source/drain region to the high-k layer. In the semiconductor structure 10, the distance from the source/drain region 112 to the high-k layer 102 is substantially zero. In the semiconductor structure 11, the distance D (or called "proximity") from the source/drain region 112 to the high-k layer 102 is greater than zero. In some embodiments, the source/drain region is formed having middle-wide profile, the tip of the source/drain region is located at a level of the greatest width of the source/drain, and the proximity defines a distance from the tip of the source/drain region to the sidewall of the high-k layer.

In some embodiments, the source/drain regions 112 are formed by ion implantation process. In some embodiments, the method of forming the source/drain region 112 includes forming recesses in the substrate 100, and growing epitaxy layers from the recesses. In some embodiments, the source/drain regions 112 include silicon carbon (SiC), silicon phosphate (SiP), SiCP or a SiC/SiP multi-layer structure for an N-type device. In other embodiments, the source/drain regions 112 include silicon germanium (SiGe) for a P-type device. In some embodiments, the source/drain region 112 may be optionally implanted with an N-type dopant or a P-type dopant as needed. In some embodiments, following the formation of the source/drain region 112, silicide layers are formed by siliciding the top portions of the source/drain region 112. In some embodiments, the silicide layers may be separated from the interfacial layer 101a and/or the high-k layer 102a.

The above embodiments in which the metal gate structure serves as a transistor is provided for illustration purposes, and are not construed as limiting the present disclosure. In some embodiments, the metal gate structure of the present application can be integrated with a memory structure as needed. The memory structure can be a ferroelectric random access memory (FERAM), a phase change random access memory (PCRAM), a resistive random access memory (RRAM) or the like.

FIG. 8 to FIG. 11 are schematic cross-sectional views of a method of forming a semiconductor structure in accordance with other embodiments. Throughout the various views and illustrative embodiments of the present disclosure, like reference numbers are used to designate like elements. It is understood that the disclosure is not limited by the method described below. Additional operations can be provided before, during, and/or after the method and some of the operations described below can be replaced or eliminated, for additional embodiments of the methods. Although FIG. 1 to FIG. 6 are described in relation to a method, it is appreciated that the structures disclosed in FIG. 1 to FIG. 6 are not limited to such a method, but instead may stand alone as structures independent of the method.

Figure 8:
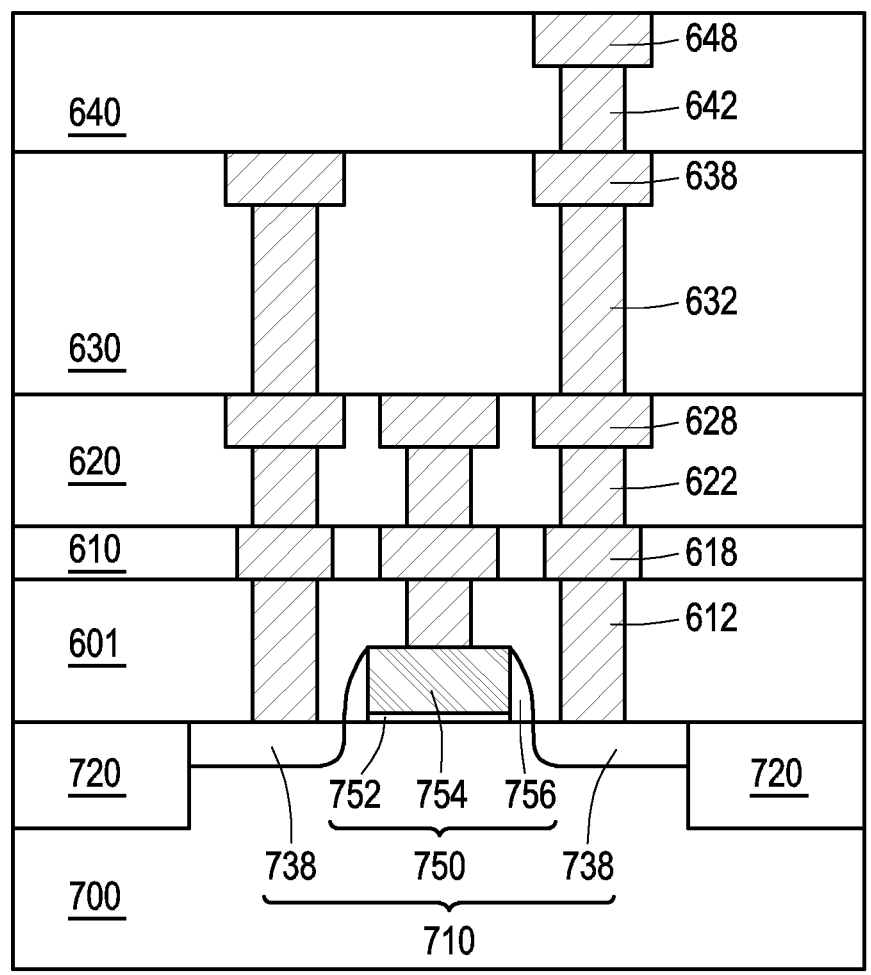
FIG. 8 to FIG. 11 are schematic cross-sectional views of a method of forming a semiconductor structure in accordance with other embodiments.

Referring to FIG. 8, a substrate 700 is provided. In some embodiments, the substrate 700 includes a silicon substrate, a silicon-on-insulator (SOI) substrate, a silicon germanium substrate, or a suitable semiconductor substrate. Other semiconductor materials including group III, group IV, and group V elements may also be used. In some embodiments, the substrate 700 is a planar substrate without fins. In other embodiments, the substrate 700 is a substrate with fins.

A transistor 710 is formed on/in the substrate 700. The transistor 710 may provide functions that are needed to operate the overlying memory structure. Specifically, the transistor 710 is configured to control the programming operation, the erase operation, and the sensing (read) operation of the memory structure. The transistor 710 may include a complementary metal-oxide-semiconductor (CMOS) transistor, a MOSFET planar transistor, a FinFET, Gate All Around (GAA) transistor or a suitable device. The substrate 700 may optionally include additional semiconductor devices, such as resistors, diodes, capacitors, etc.

Shallow trench isolation structures 720 including a dielectric material such as silicon oxide can be formed in an upper portion of the substrate 700. Suitable doped semiconductor wells, such as p-type wells and n-type wells can be formed within each area that is laterally enclosed by a continuous portion of the shallow trench isolation structures 720. Accordingly, the transistor 710 may be formed on/in the substrate 700 between the isolation structures 720, such that the transistor 710 may be electrically isolated from one another by the isolation structures 720.

The transistor 710 may include a gate structure 750 on the substrate 700, and source/drain regions 738 in the substrate 700. Each gate structure 750 can include a gate dielectric 752, a gate 754, and a spacer 756. In some embodiments, the transistor 710 is formed by a gate-last approach including forming a dummy gate and replacing the dummy gate with a metal gate. In other embodiments, the transistor 710 is formed by a gate-first approach and may have a structure similar to the metal gate structure 130 in FIG. 6.

An interconnect layer structure 690 is formed over and electrically connected to the transistor 710. The interconnect layer structure 690 includes interconnect features 680 formed within interlayer dielectric (ILD) layers 660. The ILD layers 660 can include, for example, a zeroth ILD layer 601, a first ILD layer 610, a second ILD layer 620, a third ILD layer 630 and a fourth ILD layer 640.

The interconnect features 680 may be formed by performing any suitable deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, an electroplating process, or a plasma enhanced CVD (PECVD) process.

The interconnect features may include conductive contacts 612 formed in the zeroth ILD layer 601 and that contact respective component of the transistor 710, first conductive lines 618 formed in the first ILD layer 610, first conductive vias 622 formed in a lower portion of the second ILD layer 620, second conductive lines 628 formed in an upper portion of the second ILD layer 620, second conductive vias 632 formed in a lower portion of the third ILD layer 630, third conductive lines 638 formed in an upper portion of the third ILD layer 630, third conductive vias 642 formed in a lower portion of the fourth ILD layer 640, and fourth conductive lines 648 formed in an upper portion of the fourth ILD layer 640.

Each of the dielectric layers (601, 610, 620, 630, 640) may include a low-k dielectric layer (e.g., a dielectric with a dielectric constant less than about 3.9), an ultra-low-k dielectric layer (e.g., a dielectric with a dielectric constant less than about 3.0 or less than about 2.0), or an oxide (e.g., silicon oxide). In some embodiments, each of the dielectric layers (601, 610, 620, 630, 640) may include a material such as silicon oxide, phosphosilicate glass (PSG), borophosphosilicate glass (BPSG), fluorosilicate glass (FSG), SiOC, Spin-On-Glass, Spin-On-Polymer, a silicon carbon material, a compound thereof, a composite thereof, the like, or a combination thereof, formed by any suitable method, such as spin-on coating, CVD, PECVD, ALD, the like, or a combination thereof.

Each of the interconnect features (612, 618, 622, 628, 632, 638, 642, 648) may include at least one conductive material, which can be a combination of a metallic barrier layer (such as a metallic nitride or a metallic carbide) and a metallic fill material. Each metallic barrier layer can include TiN, TaN, WN, TiC, TaC, and WC, and each metallic fill material portion can include W, Cu, Al, Co, Ru, Mo, Ta, Ti, alloys thereof, and/or combinations thereof. Other suitable materials within the contemplated scope of disclosure may also be used. In one embodiment, the metal contacts 612 and the first conductive lines 618 may be formed as integrated line and via structures by a dual damascene process, the second conductive vias 622 and the second conductive lines 628 may be formed as integrated line and via structures by a dual damascene process, the third conductive vias 632 and the third conductive lines 638 may be formed as integrated line and via structures by a dual damascene process, and/or the fourth conductive vias 642 and the fourth conductive lines 648 may be formed as integrated line and via structures by a dual damascene process. Other suitable methods (e.g., multiple single damascene processes or electroplating processes) within the contemplated scope of disclosure may also be used.

Figure 9:
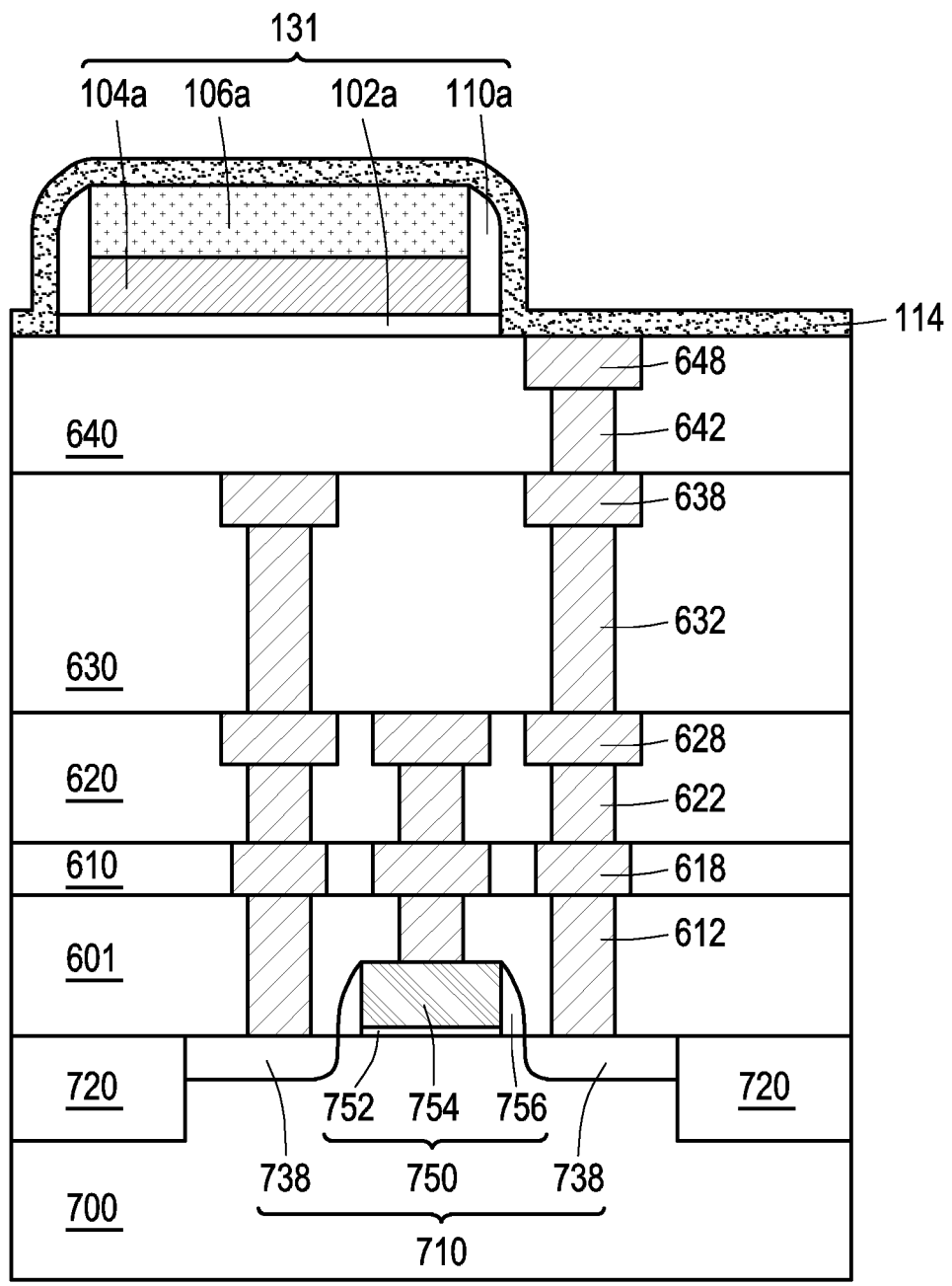

Referring to FIG. 9, a metal gate structure 131 is formed on the fourth ILD layer 640. In some embodiments, the method of forming the metal gate structure 131 is similar to the method of forming the metal gate structure 130, so the difference is illustrated below, and the similarity is not iterated herein. Specifically, the metal gate structure 131 is similar to the metal gate structure 130, and the difference lies in that the step of forming the interfacial layer 101a is omitted from the process of forming the metal gate structure 131. Other components (e.g., high-k layer 104a, metal-containing gate 104a, silicon layer 106a and spacer 110a) of the metal gate structure 131 are similar to those of the metal gate structure 130, so the materials and forming methods of the components may refer to those described in the previous embodiments.

Thereafter, a liner layer 114 is formed on the fourth ILD layer 640 covering the metal gate structure 131. In some embodiments, the liner layer 114 encapsulates the sidewall and top of the metal gate structure 131, and is in physical contact with the high-k layer 102a, the silicon layer 106a and the spacer 110a. In some embodiments, the liner layer 114 is an insulating liner layer including SiN, SiC, SiCN, SiON, SiCON, Ru, Co the like, or a combination thereof. In other embodiments, the liner layer 114 is an etch stop layer including Ru, Co the like, or a combination thereof. In some embodiments, the method of forming the liner layer 114 includes performing a suitable deposition technique, such as CVD, ALD, PVD, MBD or the like. In some embodiments, the thickness of the liner layer 114 is between about 10 nm and about 20 nm, although other values are contemplated and may be used.

In some embodiments, the liner layer 114 may be in contact with the high-k layer 102a, as shown in FIG. 9. However, the disclosure is not limited thereto. In other embodiments, another spacer (not shown) is formed on the sidewall of metal gate structure 131, covering the sidewall of the spacer 110a and the high-k layer 102a.

Figure 10:
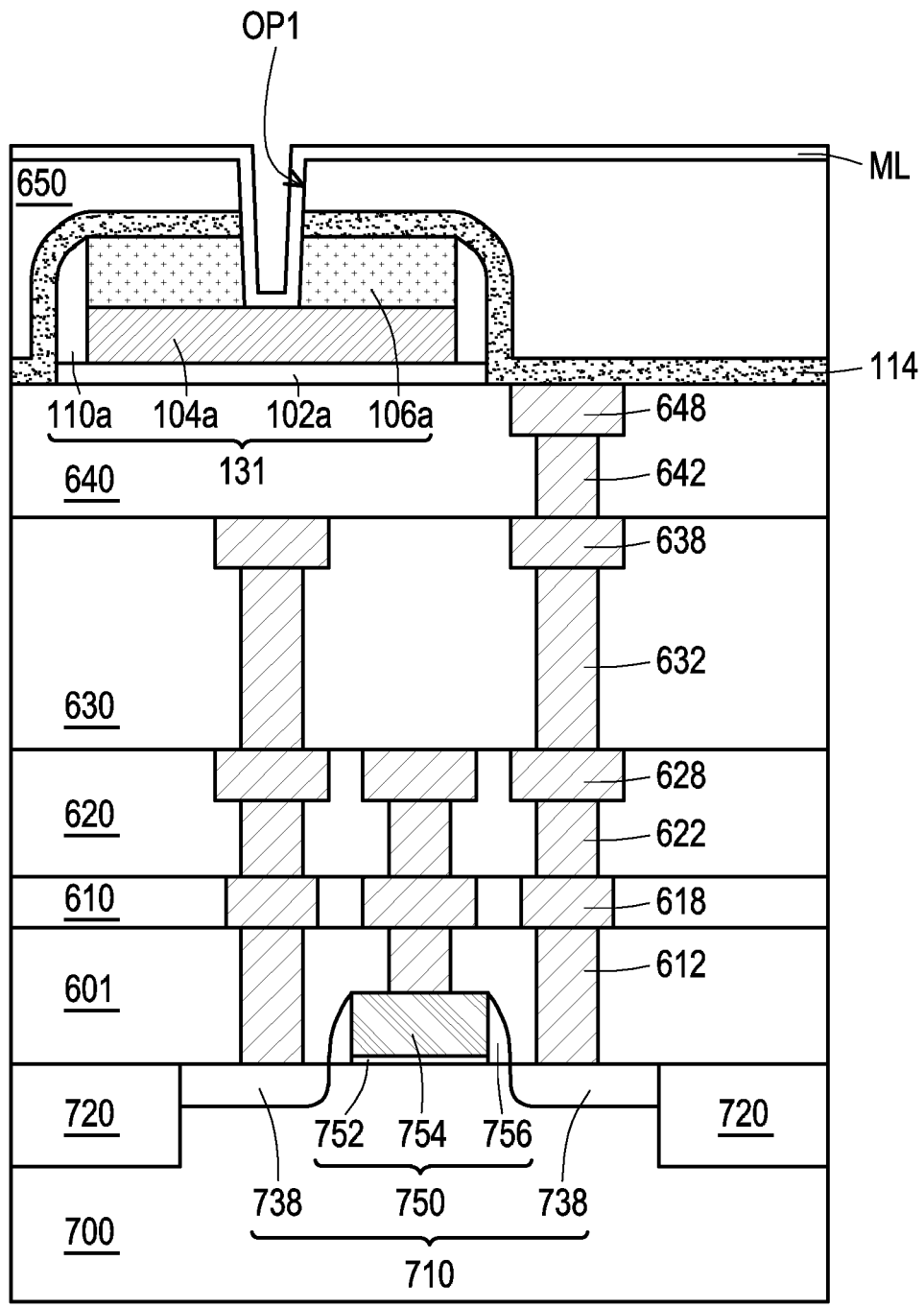

Referring to FIG. 10, a fifth ILD layer 650 is formed on the fourth ILD layer 640 covering the liner layer 114. In some embodiments, the fifth ILD layer 650 may include a low-k dielectric material having a dielectric constant lower than about 4.0, 3.0, 2.0 or even 1.5. In some embodiments, the fifth ILD layer 650 may include a material such as silicon oxide, phosphosilicate glass (PSG), borophosphosilicate glass (BPSG), HDP (high density plasma) oxide, TEOS (tetraethylorthosilicate), SiOC, SiC, a combination thereof, a multilayer thereof, or the like. The method of forming the fifth ILD layer 650 may include performing a suitable deposition technique, such as CVD, ALD, PVD, MBD or the like.

Thereafter, an opening pattern OP1 is formed through the fifth ILD layer 650, the liner layer 114 and the silicon layer 106a and exposes a portion of the metal-containing gate 104a. In some embodiments, a mask layer (e.g., a photoresist layer) is formed on the fifth ILD layer 650, covering the non-target area and exposing the target area such as the intended location of the subsequently formed via hole. Thereafter, the fifth ILD layer 650, the liner layer 114 and the silicon layer 106a are partially removed by using the mask layer as an etch mask. In some embodiments, the opening pattern OP1 can be formed having a circle-like shape, a stripe-like shape or any suitable shape as needed.

Afterwards, a memory layer ML is formed over the fifth ILD layer 650 and covers the sidewall and bottom of the opening pattern OP1.

In some embodiments, when the memory layer ML is configured for a ferroelectric random access memory (FeRAM) device, the memory layer ML includes a ferroelectric material. The ferroelectric material has an intrinsic electric dipole that can be switched between opposite polarities by application of an external electric field. The different polarities provide the FeRAM device with different capacitances that are representative of different data states (e.g., a logical '0' or '1'), thereby allowing the FeRAM device to digitally store data. In some embodiments, the ferroelectric material includes a metal, a metal-oxynitride, or a compound-metal-oxide. For example, the ferroelectric material includes lead zirconate titanate (PZT), hafnium oxide ($HfO_2$), hafnium zirconium oxide (HZO), silicon doped hafnium oxide (Si:HfO or HSO), silicon doped hafnium zirconium oxide, strontiuni bismuth tantalate ($SrBi_2Ta_2O_9$ (SBT)), lead zirconate titanate ($Pb(Zr_xTi_{1-x})O_3$ ($0 \leq x \leq 1$)), or any other suitable dielectric materials. The ferroelectric material may be formed may be formed using ALD, CVD, PECVD, the like, or a combination thereof.

In some embodiments, when the memory layer ML is configured for a phase change random access memory (PCRAM) device, the memory layer ML includes a phase change material. In some embodiments, the phase change material includes GeSbTe, such as $Ge_2Sb_2Te_5$ (GST225), $Ge_4Sb_2Te_4$ (GST424) or so forth. In certain cases, the chalcogenide material may be doped with N, Si, C, In, Ga or the like, and an example of such chalcogenide material may be doped $Ge_6Sb_1Te_2$ (GST612). In other embodiments, the phase change material includes ScSbTe, GeTe, InSb, $Sb_2Te_3$, $Sb_{70}Te_{30}$, GaSb, InSbTe, GaSeTe, $SnSbTe_4$, InSbGe, AgInSbTe, $Te_{81}Ge_{15}Sb_2S_2$, (Ge,Sn)SbTe, GeSb (SeTe) or the like. The phase change material may be formed using ALD, CVD, PECVD, the like, or a combination thereof.

In some embodiments, when the memory layer ML is configured for a resistive random access memory (RRAM) device, the memory layer ML includes a resistive-switching material. In some embodiments, the resistive-switching material includes a metal oxide, such as a transition metal oxide. The transition metal oxide may include $ZrO_2$, NiO, TiO2, HfO2, ZrO, ZnO, $WO_3$, CoO, $Nb_2O_5$, $Fe_2O_3$, CuO, $CrO_2$, $Ta_2O_5$, the like, or a combination thereof.

Some memory materials for different types of memory devices are listed above for illustration purposes. However, the disclosure is not limited thereto. Other memory materials for other memory devices (e.g., MRAM) may be applicable as needed. The memory layer ML may have a single-layer or multi-layer structure. The memory layer ML may be deposited to a thickness between about 3 nm and about 10 nm, although other values are contemplated and may be used.

Figure 11:
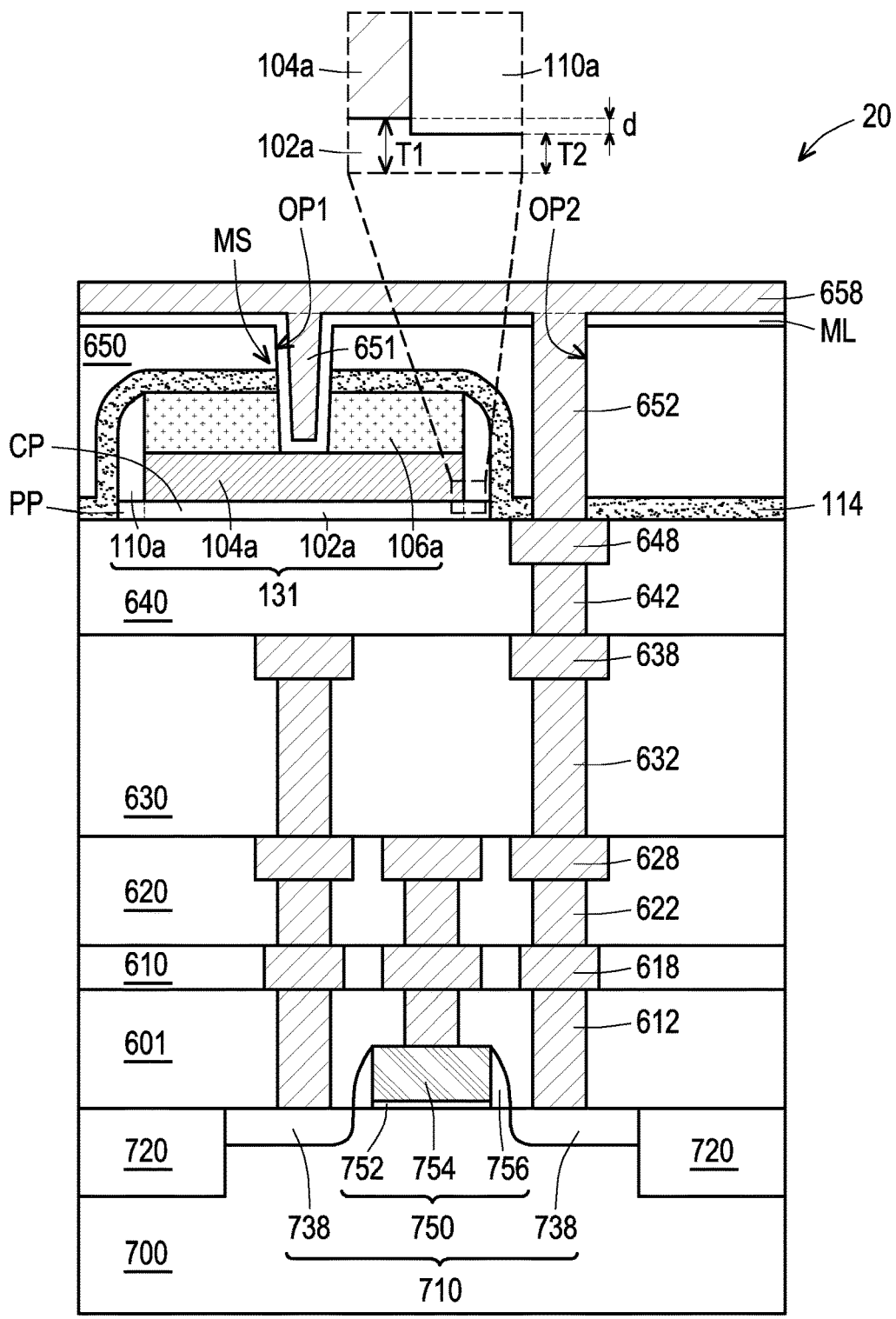

Referring to FIG. 11, an opening pattern OP2 is formed through the fifth ILD layer 650 and the liner layer 114 and exposes a portion of the fourth conductive lines 648. In some embodiments, a mask layer (e.g., a photoresist layer) is formed on the memory layer ML, covering the non-target area and exposing the target area such as the intended location of the subsequently formed via hole. Thereafter, the memory layer ML, the fifth ILD layer 650 and the liner layer 114 are partially removed by using the mask layer as an etch mask. In some embodiments, the opening pattern OP2 can be formed having a circle-like shape, a stripe-like shape or any suitable shape as needed.

Thereafter, conductive plugs 651 and 651 are formed over and electrically connected to the metal-containing gate 104a and the fourth conductive line 648. The conductive plug 651 is referred to as a "memory via", and the conductive plug 652 is referred to as a "logic via" in some examples. In some embodiments, the conductive plugs 651 and 652 are intended to represent any type of conductive materials and structures and are electrically connected to the corresponding gate and source/drain regions. In some embodiments, the conductive plugs 651 and 652 includes metal, such as Ti, Co, W, Ru, Cu, AlCu, WN, TiN, TiW, TiAl, TiAlN, the like, or a combination thereof. In some embodiments, a metal layer is formed on the fifth ILD layer 650 filling in the opening patterns OP1 and OP2, the lower portion of the metal layer within the fifth ILD layer 650 forms conductive plugs 651 and 652, and the upper portion of the metal layer over the fifth ILD layer 650 forms a fifth conductive line 658 formed over the fifth ILD layer 650. The metal layer is formed by sputtering, CVD, electrochemical plating (ECP), the like, or a combination thereof. A semiconductor device 20 of the disclosure is thus completed. In some embodiments, an interconnect layer structure In some embodiments, upon the process requirements, an upper interconnect layer structure may be formed over and electrically connected to the fifth conductive line 658 and therefore the metal gate structure 131 and the lower interconnect layer structure 690.

In some embodiments, the metal-containing gate 104a, the memory layer ML and the conductive plug 651 constitute a memory stack MS, in which the metal-containing gate 104a severs as a lower gate electrode and the conductive plug 651 serves as a top gat electrode. The lower gate electrode and the upper gate electrode may include the same or different materials. In some embodiments, the silicon layer 106a, the interfacial layer 101a, the spacer 110a, and/or the liner layer 114 can be regarded as parts of the memory stack MS, because these components can protect the metal-containing gate 104a from being damaged during the operation. In some examples, when the metal-containing gate 104a serves as a bottom electrode of the memory structure, the work function metal may be omitted from the mentioned materials in the previous embodiments. Besides, the interconnect layer structure 690 may be configured to connect the memory structure MS to the corresponding transistor 710.

In some embodiments, the memory stack or the memory structure MS may be disposed within the fifth dielectric material layer 650, and each memory stack MS may be electrically connected to a respective fourth conductive line 648 and a fifth conductive line 658. However, the present disclosure is not limited to any particular location for the memory structure MS. For example, the memory structure MS may be disposed within any of the ILD layers 660.

Figure 12:
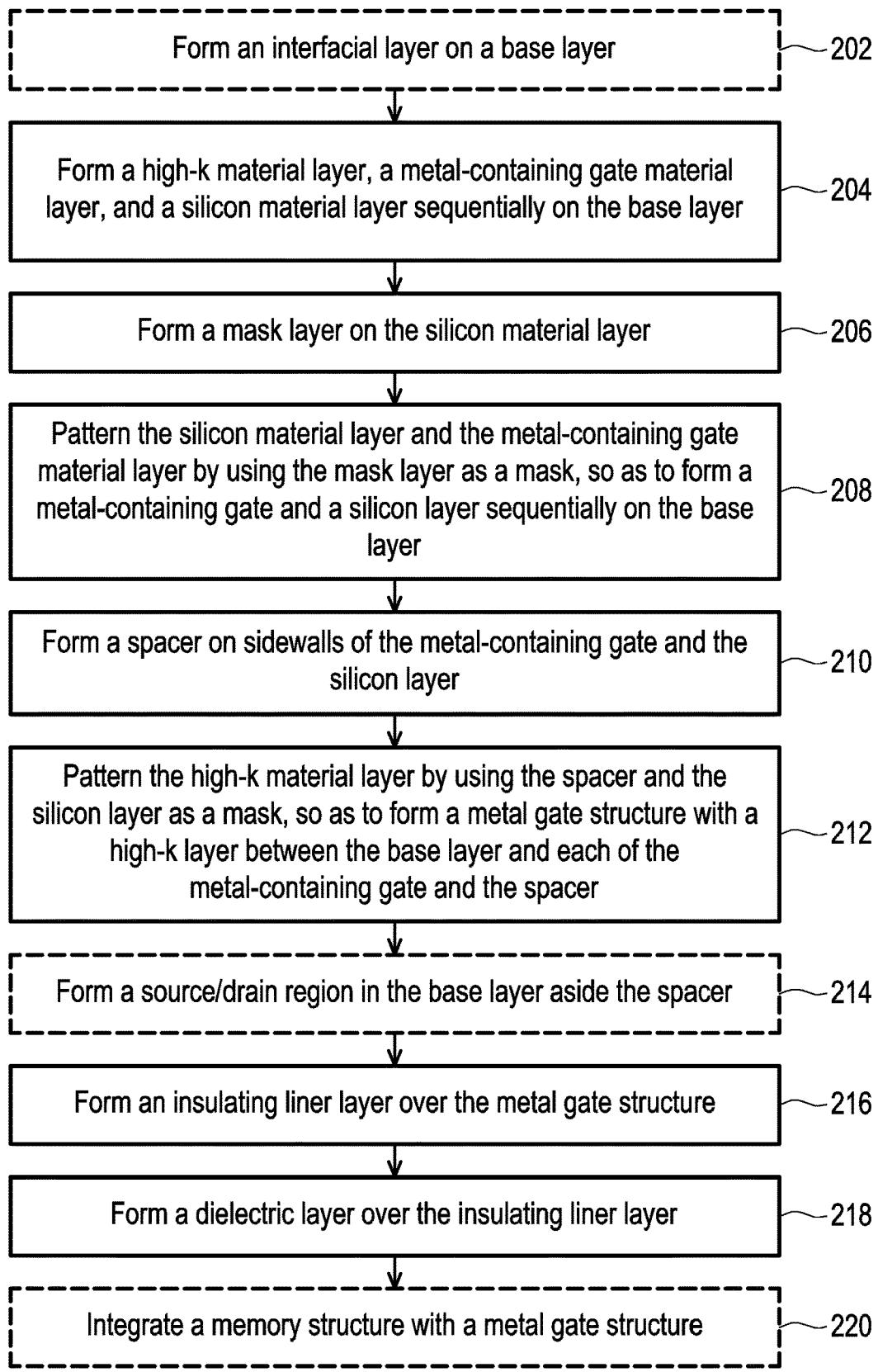
FIG. 12 illustrates a method of forming a semiconductor structure in accordance with some embodiments.

FIG. 12 illustrates a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 202, an interfacial layer is formed on a base layer. FIG. 1 illustrates a cross-sectional view corresponding to some embodiments of act 202. Act 202 may be optionally omitted as needed, as shown in FIG. 9.

At act 204, a high-k material layer, a metal-containing gate material layer, and a silicon material layer are formed sequentially on the base layer. FIG. 1 illustrates a cross-sectional view corresponding to some embodiments of act 204.

At act 206, a mask layer is formed on the silicon material layer. FIG. 2 illustrates a cross-sectional view corresponding to some embodiments of act 206.

At act 208, the silicon material layer and the metal-containing gate material layer are patterned by using the mask layer as a mask, so as to form a metal-containing gate and a silicon layer sequentially on the base layer. FIG. 3 illustrates a cross-sectional view corresponding to some embodiments of act 208. In some embodiments, the high-k material layer is partially recessed during patterning the silicon material layer the metal-containing gate material layer.

At act 210, a spacer is formed on sidewalls of the metal-containing gate and the silicon layer. FIG. 4 to FIG. 5 illustrate cross-sectional views corresponding to some embodiments of act 210.

At act 212, the high-k material layer is patterned by using the spacer and the silicon layer as a mask, so as to form a metal gate structure with a high-k layer between the base layer and each of the metal-containing gate and the spacer. FIG. 5 and FIG. 9 illustrate cross-sectional views corresponding to some embodiments of act 212.

At act 214, a source/drain region is formed in the base layer aside the spacer. FIG. 5 to FIG. 7 illustrate cross-sectional views corresponding to some embodiments of act 214. Act 214 may be optionally omitted as needed, as shown in FIG. 9.

At act 216, an insulating liner layer is formed over the metal gate structure. FIG. 6, FIG. 7 and FIG. 9 illustrate cross-sectional views corresponding to some embodiments of act 216.

At act 218, a dielectric layer is formed over the insulating liner layer. FIG. 6, FIG. 7 and FIG. 10 illustrate cross-sectional views corresponding to some embodiments of act 218.

At act 220, a memory structure is integrated with a metal gate structure. FIG. 9 and FIG. 10 illustrate cross-sectional views corresponding to some embodiments of act 220. Act 220 may be optionally omitted as needed, as shown in FIG. 6 and FIG. 7.

Figure 13:
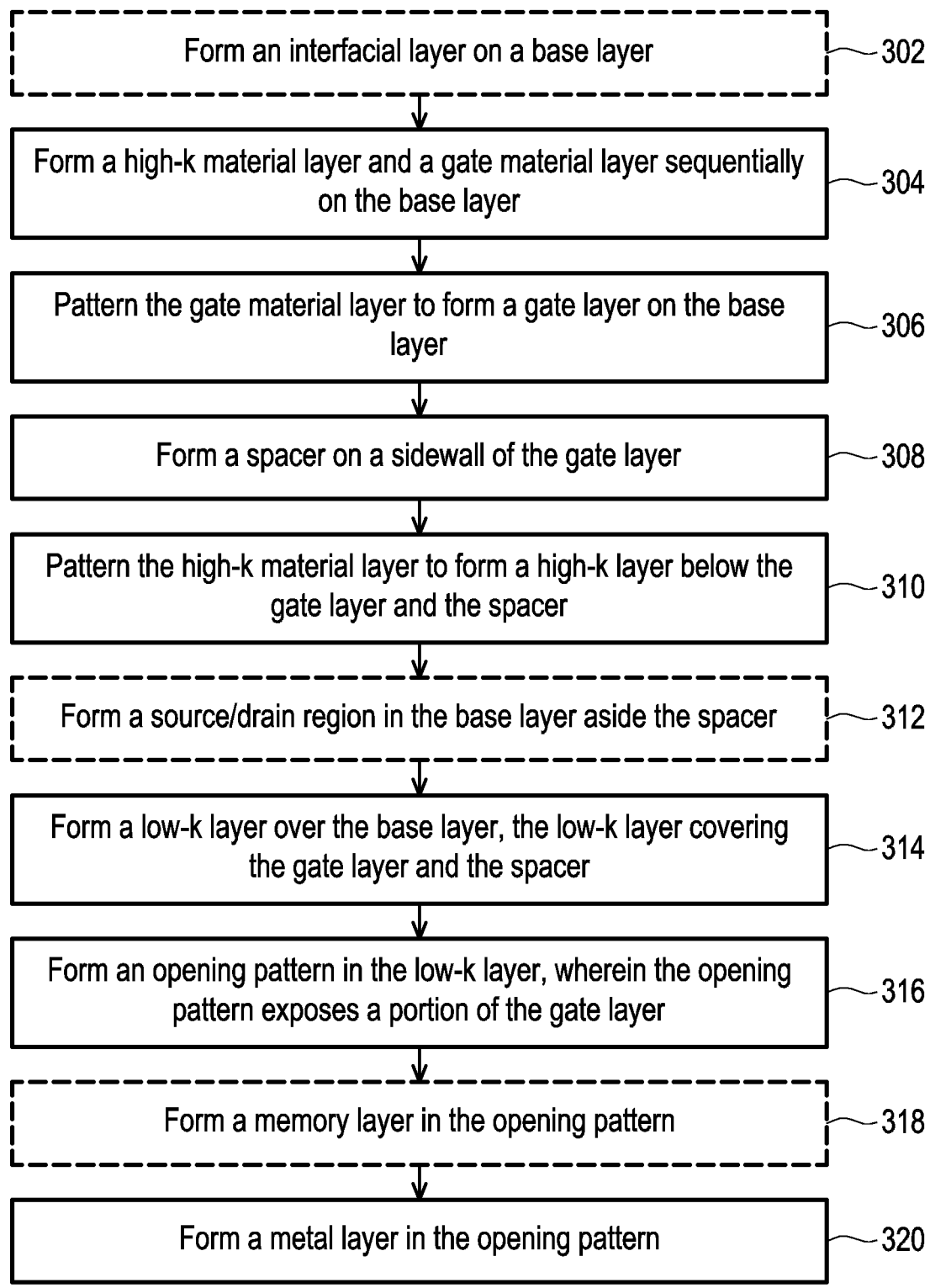
FIG. 13 illustrates a method of forming a semiconductor structure in accordance with some embodiments.

FIG. 13 illustrates a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 302, an interfacial layer is formed on a base layer. FIG. 1 illustrates a cross-sectional view corresponding to some embodiments of act 302. Act 302 may be optionally omitted as needed, as shown in FIG. 9.

At act 304, a high-k material layer and a gate material layer are sequentially formed on the base layer. FIG. 1 illustrates a cross-sectional view corresponding to some embodiments of act 304.

At act 306, the gate material layer is patterned to form a gate layer on the base layer. FIG. 3 illustrates a cross-sectional view corresponding to some embodiments of act 306. In some embodiments, the high-k material layer is partially recessed during patterning the gate material layer. In some embodiments, a silicon material layer is formed over the gate material layer, and the gate material layer and the overlying silicon material layer are patterned in the same process chamber.

At act 308, a spacer is formed on a sidewall of the gate layer. FIG. 4 to FIG. 5 illustrate cross-sectional views corresponding to some embodiments of act 308.

At act 310, the high-k material layer is patterned to form a high-k layer below the gate layer and the spacer. FIG. 5 and FIG. 9 illustrate cross-sectional views corresponding to some embodiments of act 310.

At act 312, a source/drain region is formed in the base layer aside the spacer. FIG. 5 to FIG. 7 illustrate cross-sectional views corresponding to some embodiments of act 312. Act 312 may be optionally omitted as needed, as shown in FIG. 9.

At act 314, a low-k layer is formed over the base layer, and the low-k layer covers the gate layer and the spacer.

At act 316, an opening pattern is formed in the low-k layer, wherein the opening pattern exposes a portion of the gate layer. FIG. 6, FIG. 7 and FIG. 10 illustrate cross-sectional views corresponding to some embodiments of act 316.

At act 318, a memory layer is formed in the opening pattern. FIG. 10 illustrates a cross-sectional view corresponding to some embodiments of act 318. Act 318 may be optionally omitted as needed, as shown in FIG. 6 and FIG. 7.

At act 320, a metal layer is formed in the opening pattern. FIG. 6, FIG. 7 and FIG. 11 illustrate cross-sectional views corresponding to some embodiments of act 320. In some embodiments, another opening pattern is formed in the dielectric layer after forming the memory layer and before forming the metal layer, wherein the metal layer is further formed in the another opening pattern, as shown in FIG. 11. In some embodiments, an interconnection layer structure is formed over the metal layer.

The structures of the disclosure are described with reference to FIG. 6, FIG. 7 and FIG. 11.

In accordance with some embodiments of the present disclosure, a semiconductor structure 10/11/20 includes a base layer, a metal-containing gate 104a, a high-k layer 102a and a spacer 110a. The metal-containing gate is disposed over the base layer. The high-k layer 102a has a dielectric constant greater than about 10 and disposed between the base layer and the metal-containing gate 104a. The high-k layer 102a has a protruding portion that protrudes out from a bottom of the metal-containing gate 104a. The spacer 110a is disposed on the sidewall of the metal-containing gate and covers the protruding portion of the high-k layer 102a.

In some embodiments, an interfacial layer 101a is further included in the semiconductor structure 10/11, and the interfacial layer 101a is disposed between the high-k layer 102a and the base layer (e.g., semiconductor substrate 100). In some embodiments, the dielectric constant of the interfacial layer 101a is less than the dielectric constant of the high-k layer 102a.

In some embodiments, the high-k layer 102a is thicker below the metal-containing gate 104a but thinner below the spacer 110. In some embodiments, the high-k layer 102a may be thicker in the center portion CP but thinner in the edge portion or protruding portion PP. That is, the average thickness of the protruding portion PP of the high-k layer 102a is less than the average thickness of the center portion CP of the high-k layer 102a.

In some embodiments, the high-k layer 102a is smoother below the metal-containing gate 104a but rougher below the spacer 110a. In some embodiments, the top surface of protruding portion PP of the high-k layer 102a is rougher than the top surface of the center portion CP of the 1 high-k layer 102a. Specifically, the top of the center portion CP of the high-k layer 102a below the metal-containing gate layer 104a has a substantially smooth top surface, while the top of the protruding portion PP of the high-k layer 102a outside of the metal-containing gate layer 104a has a rough and uneven top surface.

In some embodiments, a silicon layer 106a is further included in the semiconductor structure 10/11/20. The silicon layer 106a is disposed above the metal-containing layer 104a, and the spacer 100a is further disposed on the sidewall of the silicon layer 106a. In some embodiments, the silicon layer 106a includes crystal silicon, polycrystalline silicon or amorphous silicon.

In some embodiments, the base layer is a semiconductor substrate 100, as shown in FIG. 6 and FIG. 7. In some embodiments, a source/drain region 112 is further included in the semiconductor structure 10/11, and the source/drain region 11 is disposed in the semiconductor substrate 100 aside the spacer 110a. In some embodiments, the edge of the source/drain region 112 is aligned with the edge of the high-k layer 102a, as shown in FIG. 6. In other embodiments, the edge of the source/drain region 112 is misaligned with (e.g., separated from) the edge of the high-k layer 102a, as shown in FIG. 7

In some embodiments, the base layer is an interconnect layer structure 690, as shown in FIG. 11. In some embodiments, a memory layer ML and another metal-containing gate (e.g., conductive plug 651) are further included in the semiconductor structure 20. The memory layer ML is disposed over and electrically connected to the metal-containing gate 104a. The another metal-containing gate (e.g., conductive plug 651) is disposed over the memory layer ML.

In view of the above, with the method of the disclosure, the metal gate structure of the disclosure can be well defined without high-k residue remaining. The metal gate structure of the disclosure can function as a gate for a logic device or a memory device. In some embodiments, the metal gate structure is well defined without high-k residue remaining, so that the device performance is accordingly improved.

In accordance with some embodiments of the present disclosure, a semiconductor structure includes a base layer, a metal-containing gate, a high-k layer and a spacer. The metal-containing gate is disposed over the base layer. The high-k layer is disposed between the base layer and the metal-containing gate. The high-k layer has a protruding portion that protrudes out from a bottom of the metal-containing gate. The spacer is disposed on the sidewall of the metal-containing gate and covers the protruding portion of the high-k layer.

In accordance with other embodiments of the present disclosure, a method of forming a semiconductor structure includes: forming a high-k material layer, a metal-containing gate material layer, and a silicon material layer sequentially on a base layer; forming a mask layer on the silicon material layer; patterning the silicon material layer and the metal-containing gate material layer by using the mask layer as a mask, so as to form a metal-containing gate and a silicon layer sequentially on the base layer; forming a spacer on sidewalls of the metal-containing gate and the silicon layer; and patterning the high-k material layer by using the spacer and the silicon layer as a mask, so as to form a high-k layer between the base layer and each of the metal-containing gate and the spacer.

In accordance with yet other embodiments of the present disclosure, a method of forming a semiconductor structure includes: forming a high-k material layer and a gate material layer sequentially on a base layer; patterning the gate material layer to form a gate layer on the base layer; forming a spacer on a sidewall of the gate layer; patterning the high-k material layer to form a high-k layer below the gate layer and the spacer; forming a low-k layer over the base layer, the low-k layer covering the gate layer and the spacer; forming an opening pattern in the dielectric layer, wherein the opening pattern exposes a portion of the gate layer; and forming a memory layer and a metal layer in the opening pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    forming a high-k material layer, a metal-containing gate material layer, and a silicon material layer sequentially on a base layer, wherein the base layer is an interconnect layer structure, and the high-k material layer is in contact with a dielectric material of the interconnect layer structure, and wherein the silicon material layer is an undoped silicon layer;
    patterning the silicon material layer and the metal-containing gate material layer to form a metal-containing gate and a silicon layer sequentially on the base layer;
    forming a spacer on sidewalls of the metal-containing gate and the silicon layer, and
    patterning the high-k material layer by using the spacer and the silicon layer as a mask, so as to form a high-k layer between the base layer and each of the metal-containing gate and the spacer.

2. The method of claim 1, wherein the high-k material layer is partially recessed during patterning the silicon material layer and the metal-containing gate material layer.

3. The method of claim 1, further comprising forming an interfacial layer between the high-k material layer and the base layer.

4. The method of claim 1, further comprising forming a source/drain region in the base layer aside the spacer.

5. The method of claim 1, wherein patterning the silicon material layer and the metal-containing gate material layer comprises:
    forming a mask layer on the silicon material layer;
    patterning the silicon material layer and the metal-containing gate material layer by using the mask layer as a mask.

6. A method of forming a semiconductor structure, comprising:
    forming a high-k material layer and a gate material layer sequentially on a base layer, wherein the base layer is an interconnect layer structure, and the high-k material layer is in contact with a dielectric material of the interconnect layer structure;
    patterning the gate material layer to form a gate layer on the base layer;
    forming a spacer on a sidewall of the gate layer;
    patterning the high-k material layer to form a high-k layer below the gate layer and the spacer;
    forming a low-k layer over the base layer, the low-k layer covering the gate layer and the spacer;
    forming an opening pattern in the low-k layer, wherein the opening pattern exposes a portion of the gate layer; and
    forming a memory layer and a metal layer in the opening pattern,
    wherein the method further comprises forming a silicon material layer over the gate material layer before patterning the gate material layer, wherein the silicon material layer is an undoped silicon layer.

7. The method of claim 6, further comprising forming an interconnect layer structure over the metal layer.

8. The method of claim 6, further comprising forming another opening pattern in the low-k layer after forming the memory layer and before forming the metal layer, wherein the metal layer is further formed in the another opening pattern.

9. The method of claim 6, wherein the high-k material layer is separated from a conductive feature of the interconnect layer structure.

10. The method of claim 6, further comprising forming an interfacial material layer between the high-k material layer and the base layer.

11. The method of claim 6, wherein the high-k material layer is partially recessed during patterning the gate material layer.

12. A method of forming a semiconductor structure, comprising:
    forming a high-k material layer, a gate material layer and a silicon material layer sequentially on a base layer, wherein the base layer is an interconnect layer structure, and the high-k material layer is in contact with a dielectric material of the interconnect layer structure, and wherein the silicon material layer is an undoped silicon layer;
    patterning the silicon material layer, and the gate material layer to form a gate layer and a silicon layer sequentially on the base layer;
    forming a spacer on a sidewall of the gate layer; and
    patterning the high-k material layer by using the spacer as a mask, so as to form a high-k layer below the gate layer and the spacer.

13. The method of claim 12, wherein the silicon material layer comprises crystal silicon, polycrystalline silicon or amorphous silicon.

14. The method of claim 12, further comprising:
forming a liner layer over the base layer, the liner layer covering the silicon layer and the spacer; and
forming a dielectric layer over the liner layer.

15. The method of claim 14, further comprising:
forming an opening pattern in the dielectric layer and the liner layer, wherein the opening pattern exposes a portion of the gate layer; and
forming a memory layer and a metal layer in the opening pattern.

16. The method of claim 15, further comprising forming another opening pattern in the dielectric layer and the liner layer after forming the memory layer and before forming the metal layer, wherein the metal layer is further formed in the another opening pattern.

17. The method of claim 12, further comprising forming an interfacial material layer between the high-k material layer and the base layer.

18. The method of claim 12, wherein the high-k material layer is partially recessed during patterning the gate material layer.

19. The method of claim 12, wherein the high-k material layer is separated from a conductive feature of the interconnect layer structure.

20. The method of claim 12, patterning the silicon material layer and the gate material layer comprises:
forming a mask layer on the silicon material layer; and
patterning the silicon material layer and the metal-containing gate material layer by using the mask layer as a mask.

* * * * *